(12) United States Patent
Kanda et al.

(10) Patent No.: US 11,257,918 B2
(45) Date of Patent: Feb. 22, 2022

(54) SEMICONDUCTOR DEVICE AND METHOD OF MANUFACTURING THE DEVICE

(71) Applicant: Panasonic Intellectual Property Management Co., Ltd., Osaka (JP)

(72) Inventors: Yusuke Kanda, Toyama (JP); Hideyuki Okita, Toyama (JP); Manabu Yanagihara, Osaka (JP); Takeshi Harada, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 38 days.

(21) Appl. No.: 16/723,761

(22) Filed: Dec. 20, 2019

(65) Prior Publication Data

US 2020/0144386 A1 May 7, 2020

Related U.S. Application Data

(63) Continuation of application No. PCT/JP2018/023925, filed on Jun. 25, 2018.

(30) Foreign Application Priority Data

Jul. 7, 2017 (JP) .............................. JP2017-133454

(51) Int. Cl.
  *H01L 29/778* (2006.01)
  *H01L 29/45* (2006.01)
  (Continued)

(52) U.S. Cl.
  CPC ...... *H01L 29/452* (2013.01); *H01L 21/28575* (2013.01); *H01L 21/30621* (2013.01);
  (Continued)

(58) Field of Classification Search
  None
  See application file for complete search history.

(56) References Cited

U.S. PATENT DOCUMENTS

| 2006/0284318 | A1 | 12/2006 | Murata et al. |
| 2015/0076562 | A1 | 3/2015 | Yasui et al. |
| 2015/0221758 | A1* | 8/2015 | Miura ................... H01L 29/205 257/76 |

FOREIGN PATENT DOCUMENTS

| JP | 2006-351762 A | 12/2006 |
| JP | 6018809 B2 | 11/2016 |

OTHER PUBLICATIONS

Baca, A. "An AlN/Al0.85Ga0.15N high electron mobility transistor" App. Phys. Lett. 109 Jun. 22, 2016 pp. 1-4 (Year: 2016).*

(Continued)

*Primary Examiner* — Grant S Withers
(74) *Attorney, Agent, or Firm* — McDermott Will & Emery LLP

(57) ABSTRACT

A semiconductor device includes a substrate; a first nitride semiconductor layer above the substrate; a second nitride semiconductor layer on the first nitride semiconductor layer; an ohmic electrode above the substrate; and a contact layer in contact with at least a part of the ohmic electrode, the contact layer containing silicon and chlorine. The second nitride semiconductor layer has a wider band gap than the first nitride semiconductor layer. A two-dimensional electron gas channel is formed in the first nitride semiconductor layer at a heterointerface between the first nitride semiconductor layer and the second nitride semiconductor layer. A silicon concentration has a higher peak value than a chlorine concentration in the contact layer.

14 Claims, 9 Drawing Sheets

(51) Int. Cl.
*H01L 21/285* (2006.01)
*H01L 21/306* (2006.01)
*H01L 29/20* (2006.01)
*H01L 29/205* (2006.01)
*H01L 29/66* (2006.01)

(52) U.S. Cl.
CPC ........ *H01L 29/2003* (2013.01); *H01L 29/205* (2013.01); *H01L 29/66462* (2013.01); *H01L 29/7786* (2013.01); *H01L 29/7787* (2013.01)

(56) References Cited

OTHER PUBLICATIONS

Lee, K. N. "Surface Chemical Treatment for the Cleaning of AlN and GaN surfaces" Jour. of the Elec. Chem. Soc. 147 (8) Feb. 2000 pp. 3087-3090 (Year: 2000).*
Douglas, E. "Ohmic Contacts to Al-rih AlGaN heterostructures" Phys. Status Solidi A 214, No. 8 Jun. 6, 2017 pp. 1-9 (Year: 2017).*
Huang, T. "DC and RF Performance of Gate-Last AlN/GaN MOSHEMTs on Si With Regrown Source/Drain" IEEE Trans. on Elec. Dev. vol. 60, Iss. 10, Aug. 8, 2013 pp. 1-6 (Year: 2013).*
Jang, H.W. "Room Temperature Ohmic contact on n-type GaN using plasma treatment" MRS Int. Jour. Nit. Semi. Res. 6, 8 Jan. 2001 pp. 1-4 (Year: 2001).*
International Search Report issued in corresponding International Patent Application No. PCT/JP2018/023925, dated Aug. 14, 2018, with English translation.

* cited by examiner

SEMICONDUCTOR DEVICE AND METHOD OF MANUFACTURING THE DEVICE

CROSS REFERENCE TO RELATED APPLICATIONS

This application is a U.S. continuation application of PCT International Patent Application Number PCT/JP2018/023925 filed on Jun. 25, 2018, claiming the benefit of priority of Japanese Patent Application Number 2017-133454 filed on Jul. 7, 2017, the entire contents of which are hereby incorporated by reference.

BACKGROUND

1. Technical Field

The present disclosure relates to a semiconductor device and a method of manufacturing the device, and particularly to a group-III nitride semiconductor device made of group-III nitride semiconductor and a method of manufacturing the device.

2. Description of the Related Art

Group-III nitride semiconductor devices made of group-III nitride semiconductor, particularly, gallium nitride (GaN) or aluminum gallium nitride (AlGaN) have high breakdown voltages because of the wide-band gap materials. In addition, group-III nitride semiconductor devices easily form a heterostructure such as AlGaN/GaN.

In an AlGaN/GaN heterostructure, the difference in the piezoelectric polarization occurring due to the difference in the lattice constant between the materials and spontaneous polarization of AlGaN and GaN form two-dimensional electron gas (hereinafter referred to as 2DEG) channel (hereinafter referred to as a 2DEG channel) of high-concentration electrons in the GaN layer of the AlGaN/GaN interface. Group-III nitride semiconductor devices utilizing this 2DEG channel are applied as radio frequency power devices due to their high electron saturation velocity, insulation resistance, and thermal conductivity.

In order to improve the characteristics of such a group-III nitride semiconductor device, the contact (hereinafter referred to as "ohmic contact") between an ohmic electrode and 2DEG or a parasitic resistance component such as a resistance of the 2DEG channel in the group-III nitride semiconductor device may be reduced as much as possible.

Japanese Unexamined Patent Application Publication No. 2006-351762 and Japanese Patent No. 6018809 disclose how to reduce the ohmic contact resistance between an ohmic electrode and 2DEG.

Japanese Unexamined Patent Application Publication No. 2006-351762 describes forming an ohmic electrode on a superlattice layer that is a multilayer of AlGaN and GaN and implanting silicon ions into the superlattice layer and the AlGaN surface in contact with the superlattice layer so that polarization changes generated in the superlattice layer excite and cause a large number of electrons. This is supposed to reduce the potentials of the electrons in AlGaN, which reduces the ohmic contact resistance.

On the other hand, Japanese Patent No. 6018809 describes implanting oxygen ions and chlorine ions to an AlGaN surface in contact with an ohmic electrode formed by sequentially stacking a Ti film and an Al film so that peak values of the oxygen concentration and the chlorine concentration fall within certain ranges. This is supposed to reduce the ohmic contact resistance.

SUMMARY

In the method described in Japanese Unexamined Patent Application Publication No. 2006-351762, the maximum electron concentration achieved by the heterostructure of AlGaN and GaN is, in the volume concentration, $5 \times 10^{19}$ cm$^{-3}$, higher than the activation rate (i.e., $5 \times 10^{18}$ cm$^{-3}$ to $3 \times 10^{19}$ cm$^{-3}$) of the silicon ions implanted using a typical ion implanter. Even by this method, the ohmic contact resistance can be reduced to be at most, less than about 0.4 Ω·mm.

It is also difficult to reduce the ohmic contact resistance in the method described in Japanese Patent No. 6018809. In the AlGaN surface in contact with the ohmic electrode formed by sequentially stacking the Ti film and the Al film, the peak values of the oxygen concentration and the chlorine concentration fall within ranges from $1.1 \times 10^{18}$ cm$^{-3}$ to $6.8 \times 10^{18}$ cm$^{-3}$ and from $5.0 \times 10^{16}$ cm$^{-3}$ to $9.6 \times 10^{17}$ cm$^{-3}$, respectively. Even within the certain narrow and low concentration ranges, the ohmic contact resistance decreases to be at most about 1.0 Ω·mm. In the method of Japanese Patent No. 6018809, there is rather a disadvantage of increasing the ohmic contact resistance outside the certain narrow and low concentration ranges. In particular, the chlorine present as the chlorine ions in AlGaN may serve as negative fixed charges. That is, AlGaN is charged negatively to increase the potentials of the electrons in AlGaN and thus increases the ohmic contact resistance.

In this manner, reduction in the ohmic contact resistance is limited and the ohmic contact resistance is not sufficiently reduced in the background art.

The present disclosure was made in view of the problem. It is an objective of the present disclosure to a semiconductor device capable of sufficiently reducing ohmic contact resistance.

In order to achieve the objective, a semiconductor device according to an aspect of the present disclosure includes: a substrate; a first nitride semiconductor layer above the substrate; a second nitride semiconductor layer on the first nitride semiconductor layer; an ohmic electrode above the substrate; and a contact layer in contact with at least a part of the ohmic electrode, the contact layer containing silicon and chlorine. The second nitride semiconductor layer has a wider band gap than the first nitride semiconductor layer. A two-dimensional electron gas channel is formed in the first nitride semiconductor layer at a heterointerface between the first nitride semiconductor layer and the second nitride semiconductor layer. In the contact layer, a peak value of a silicon concentration is greater than a peak value of a chlorine concentration.

With this configuration, the chlorine of the contact layer properly etches the group-III atoms of the first nitride semiconductor layer and the second nitride semiconductor layer at the thermal treatment for activating the silicon ions. This facilitates the entry of the silicon ions into the sites of the group-III atoms, thereby promoting the activation of the silicon. In addition, the silicon concentration has a higher peak value than the chlorine concentration in the contact layer. This increases the activated silicon ions as positive fixed charges relative to the chlorine ions serving as negative fixed charges, and thereby reduces the potentials of the first nitride semiconductor layer and the second nitride semiconductor layer. Accordingly, the ohmic contact resistance sufficiently decreases as compared to the background art such as Japanese Unexamined Patent Application Publication No. 2006-351762 or Japanese Patent No. 6018809, for example.

In the semiconductor device according to another aspect of the present disclosure, the contact layer may be located within a depth of 30 nm from an interface between the ohmic electrode and the contact layer. In the contact layer, the silicon concentration may be higher than the chlorine concentration.

In this manner, the contact layer is formed within the narrow region, the depth of 30 nm from the interface between the ohmic electrode and the contact layer. This reduces scattering of electrons in silicon and chlorine. In addition, the silicon concentration is higher than the chlorine concentration within the depth of 30 nm of the contact layer. This reduces the potential of the entire region of the contact layer. Accordingly, the ohmic contact resistance sufficiently decreases.

In the semiconductor device according to another aspect of the present disclosure, in the contact layer, the peak value of the chlorine concentration may be $1 \times 10^{18}$ cm$^{-3}$ or greater.

This configuration allows the contact layer to contain chlorine at the concentration of $1 \times 10^{18}$ cm$^{-3}$ or higher and thus further promotes the activation of silicon. Accordingly, the ohmic contact resistance further decreases.

In the semiconductor device according to another aspect of the present disclosure, a lower surface of the contact layer may be located inside the second nitride semiconductor layer. The chlorine concentration may be $1 \times 10^{17}$ cm$^{-3}$ or lower between the lower surface of the contact layer and the heterointerface.

This configuration reduces an increase in the potential between the heterointerface and the lower surface of the contact layer of the second nitride semiconductor layer. Accordingly, the ohmic contact resistance sufficiently decreases.

In the semiconductor device according to another aspect of the present disclosure, a lower surface of the contact layer may reach the heterointerface.

This configuration increases the carrier concentration in the 2DEG and thus sufficiently reduces the ohmic contact resistance.

In the semiconductor device according to another aspect of the present disclosure, all or part of a lower surface of the ohmic electrode may be formed on a recess formed by removing a part of the second nitride semiconductor layer.

This configuration eliminates damages of the surface in the step of forming the second nitride semiconductor layer and reduces the thickness of the second nitride semiconductor layer. Accordingly, the ohmic contact resistance sufficiently decreases.

In the semiconductor device according to another aspect of the present disclosure, all or part of a lower surface of the ohmic electrode may be formed on a recess formed by removing an entire region of the second nitride semiconductor and a part of the first nitride semiconductor layer under the ohmic electrode.

According to this configuration, the ohmic electrode and the 2DEG channel are also electrically connected together on the side surfaces of the ohmic electrode. This requires no current path through the second nitride semiconductor layer or reduces the effective thickness of the second nitride semiconductor layer in the current path, thereby further reducing the ohmic contact resistance.

In the semiconductor device according to another aspect of the present disclosure, in a plan view, an end of the ohmic electrode may be flush with an end of the contact layer or may protrude beyond the end of the contact layer. The silicon concentration may be higher than the chlorine concentration within 30 nm from the end of the contact layer in the plan view.

This configuration reduces the potential of the second nitride semiconductor layer on the oblique current path at the end of the contact layer. Accordingly, the ohmic contact resistance sufficiently decreases.

The semiconductor device according to another aspect of the present disclosure may further include: a counter electrode. A voltage may be applied between the counter electrode and the ohmic electrode. The ohmic electrode may protrude beyond the contact layer toward the counter electrode in a plan view.

This configuration reduces the electric field concentrated at the end of the ohmic electrode and thus reduces the breakage of the device.

The semiconductor device according to another aspect of the present disclosure may further include: an insulating film with an opening, on the second nitride semiconductor layer. The ohmic electrode may cover the opening. The insulating film may include an insulating layer containing chlorine. In the insulating layer, a peak value of a chlorine concentration may be $1 \times 10^{18}$ cm$^{-3}$ or greater.

In this manner, the insulating layer containing chlorine is formed by allowing the insulating film to contain chlorine, thereby reducing electrons trapped in the insulating layer to reduce current collapse.

In this case, a part of the insulating layer other than a region under the ohmic electrode may have a lower chlorine concentration than the region of the insulating layer under the ohmic electrode.

There is a fear that the insulating layer containing chlorine may cause a decrease in the adhesion between the insulating layer and the films in contact with the insulating layer. This configuration reduces such a decrease in the adhesion with the films. There is also a fear that the insulating layer containing chlorine reduces the breakdown voltage of the insulating film to generate leakage. The part other than the region under the ohmic electrode has a lower chlorine concentration than the region under the ohmic electrode. This reduces a decrease in the breakdown voltage of the insulating film. Accordingly, leakage decreases.

A method of manufacturing a semiconductor device according to an aspect of the present disclosure includes: forming a first nitride semiconductor layer above a substrate; forming a second nitride semiconductor layer with a wider band gap than the first nitride semiconductor layer on the first nitride semiconductor layer; forming a contact layer containing silicon and chlorine, in the second nitride semiconductor layer by performing plasma treatment containing SiCl$_4$ gas; after forming the contact layer, performing first thermal treatment at a temperature within a range from 450° C. to 900° C.; after the first thermal treatment, forming an ohmic electrode on the contact layer; and after forming the ohmic electrode, performing second thermal treatment at a temperature of 900° C. or lower.

With this configuration, the scattering of chlorine decreases and the chlorine of the contact layer properly etches the group-III atoms of the first nitride semiconductor layer and the second nitride semiconductor layer to activate the silicon ions. Accordingly, the ohmic contact resistance sufficiently decreases.

The method of manufacturing the semiconductor device according to another aspect of the present disclosure may further include: after forming the second nitride semiconductor layer, forming an insulating film with an opening on the second nitride semiconductor layer, and performing plasma treatment containing $SiCl_4$ gas using the insulating film as a mask. In forming the ohmic electrode, the ohmic electrode is formed to cover the opening of the insulating film.

According to this configuration, the contact layer is formed using the insulating film as the mask and the insulating film contains chlorine. This reduces the electrons trapped in the insulating film, thereby reducing current collapse.

In the method of manufacturing the semiconductor device according to another aspect of the present disclosure, in the plasma treatment, conditions of the plasma treatment containing $SiCl_4$ gas may be adjusted to set a peak value of a chlorine concentration to $1\times10^{18}$ $cm^{-3}$ or greater in the contact layer.

This configuration contains chlorine at a high concentration and thus further promotes the activation of the silicon. Accordingly, the ohmic contact resistance further decreases sufficiently.

The present disclosure sufficiently reduces ohmic contact resistance.

BRIEF DESCRIPTION OF DRAWINGS

These and other objects, advantages and features of the disclosure will become apparent from the following description thereof taken in conjunction with the accompanying drawings that illustrate specific embodiments of the present disclosure.

DETAILED DESCRIPTION OF THE EMBODIMENTS

Embodiment of the present disclosure will now be described with reference to the drawings. Note that the embodiments described below are mere preferred specific examples of the present disclosure. The numerical values, shapes, materials, constituent elements, the arrangement and connection of the constituent elements, steps, step orders etc. shown in the following embodiments are thus mere examples, and are not intended to limit the scope of the present disclosure. Among the constituent elements in the following embodiments, those not recited in any of the independent claims defining the broadest concept of the present disclosure are described as optional constituent elements.

The figures are schematic representations and not necessarily drawn strictly to scale. The scales are thus not necessarily the same in the figures. In the figures, substantially the same constituent elements are assigned with the same reference marks, and redundant descriptions will be omitted or simplified.

Embodiment 1

Figure 1:
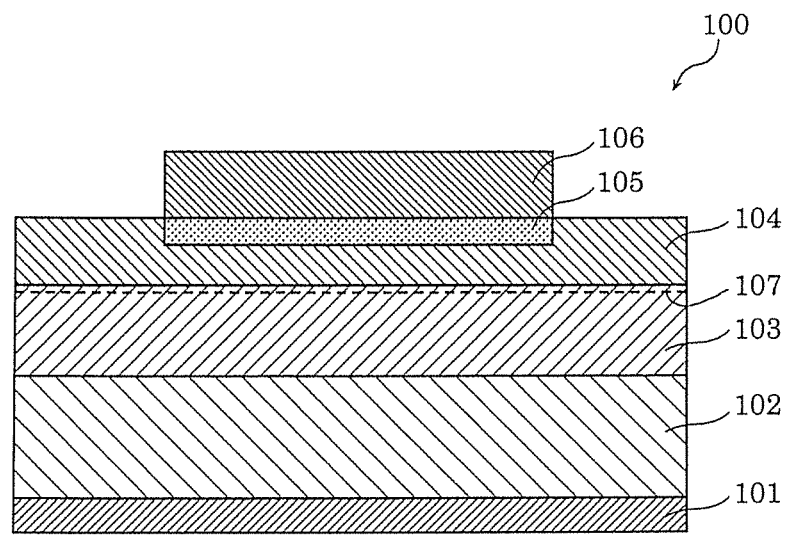
FIG. 1 is a cross-sectional view illustrating a configuration of a semiconductor device according to Embodiment 1.

First, semiconductor device 100 according to Embodiment 1 will be described with reference to FIG. 1. FIG. 1 is a cross-sectional view illustrating a configuration of semiconductor device 100 according to Embodiment 1.

As shown in FIG. 1, semiconductor device 100 includes substrate 101, buffer layer 102, first nitride semiconductor layer 103, second nitride semiconductor layer 104, contact layer 105, and ohmic electrode 106.

Substrate 101 is made of Si, for example. The material of substrate 101 is however not limited to Si but may also be sapphire, SiC, GaN, or AlN, for example.

Buffer layer 102 is formed on substrate 101. Buffer layer 102 is a nitride semiconductor layer, for example, with a thickness of 2 µm and a multilayer structure AlN and AlGaN. Alternatively, buffer layer 102 may be a single layer or a multilayer of group-III nitride semiconductor such as GaN, AlGaN, AlN, InGaN, and AlInGaN.

First nitride semiconductor layer 103 is formed above substrate 101. In this embodiment, first nitride semiconductor layer 103 is formed on buffer layer 102. For example, first nitride semiconductor layer 103 may have a thickness of 2 µm and may be made of undoped (i-)GaN. The term "undoped (i-)" here means that impurities are not intentionally doped at the time of epitaxial growth.

The material of first nitride semiconductor layer 103 is not limited to GaN and may also be group-III nitride semiconductor such as InGaN, AlGaN, and AlInGaN. In addition, first nitride semiconductor layer 103 may contain n-type impurities.

Second nitride semiconductor layer 104 is formed on first nitride semiconductor layer 103. For example, second nitride semiconductor layer 104 may have a thickness of 60 nm and may be made of undoped (i-)AlGaN containing 15% of Al.

The material of second nitride semiconductor layer 104 is not limited to AlGaN and may also be group-III nitride semiconductor such as AlInGaN. In addition, second nitride semiconductor layer 104 may contain n-type impurities.

In this embodiment, second nitride semiconductor layer 104 has a wider band gap than first nitride semiconductor layer 103. Second nitride semiconductor layer 104 of undoped. AlGaN and first nitride semiconductor layer 103 of undoped GaN form a heterostructure. That is, the interface between second nitride semiconductor layer 104 and first nitride semiconductor layer 103 is a heterojunction. At the interface between second nitride semiconductor layer 104 and first nitride semiconductor layer 103, a heterobarrier is formed.

As a result, 2DEG 107 is generated to form a 2DEG channel in first nitride semiconductor layer 103 at the heterointerface between second nitride semiconductor layer 104 and first nitride semiconductor layer 103. That is, first nitride semiconductor layer 103 is a two-dimensional electron gas layer containing 2DEG 107.

On second nitride semiconductor layer 104, a semiconductor layer, for example, made of GaN with a thickness of about 1 nm to 2 nm may be located as a cap layer.

In the part of second nitride semiconductor layer 104 corresponding to ohmic electrode 106, contact layer (i.e., contact region) 105 is formed. Contact layer 105 is formed in the upper layer part of second nitride semiconductor layer 104. Contact layer 105 is in contact with at least a part of ohmic electrode 106. In this embodiment, contact layer 105 is formed right under ohmic electrode 106. Contact layer 105 contains silicon and chlorine.

Ohmic electrode 106 is formed above substrate 101. Specifically, ohmic electrode 106 is formed on contact layer 105. In this embodiment, ohmic electrode 106 is a multilayer electrode film formed sequentially stacking a Ti film and an Al film, for example. The material of ohmic electrode 106 is not limited to the combination of Ti and Al, and may be a single layer electrode film of one type of metal of Ti, Au, Ta, Al, Mo, Hf, or Zr or a multilayer electrode film formed by combining two or higher types of the metal.

Ohmic electrode 106 is electrically connected to 2DEG 107. Specifically, ohmic electrode 106 is electrically connected to 2DEG 107 through contact layer 105 at the bottom of ohmic electrode 106.

Figure 2:
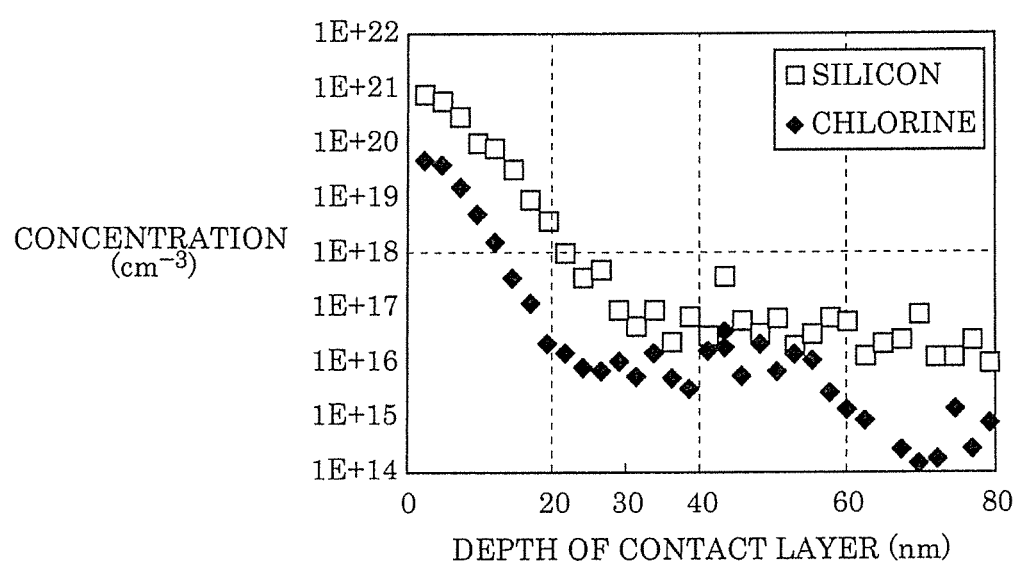
FIG. 2 illustrates an impurity concentration distribution along the depth of a layer (i.e., a contact layer) under an ohmic electrode in the semiconductor device according to Embodiment 1.

FIG. 2 illustrates an impurity concentration distribution along the depth of contact layer 105 (downward from the interface between ohmic electrode 106 and contact layer 105) in this embodiment.

As shown in FIG. 2, the silicon concentration has a higher peak value than the chlorine concentration in contact layer 105.

Contact layer 105 is located within a depth of 30 nm from the interface between ohmic electrode 106 and contact layer 105. With respect to the impurity concentrations in contact layer 105, the silicon concentration is higher than the chlorine concentration within the depth of 30 nm of contact layer 105. The peak value of the chlorine concentration is $1 \times 10^{18}$ cm$^{-3}$ or higher in contact layer 105. The chlorine concentration is $1 \times 10^{17}$ cm$^{-3}$ or lower between the lower surface of contact layer 105 and the heterointerface.

Semiconductor device 100 with this configuration reduces the potential of second nitride semiconductor layer 104 and thus reduces the ohmic contact resistance. The reasons will now be described.

As will be described later, this embodiment includes thermal treatment for activating the silicon ions in contact layer 105. At the time of thermal treatment, the chlorine of contact layer 105 properly etches Ga atoms in second nitride semiconductor layer 104. This facilitates the entry of the silicon ions into the sites of the Ga atoms to promote the activation of the silicon. In addition, the silicon concentration has a higher peak value than the chlorine concentration in contact layer 105. This increases the activated silicon ions as positive fixed charges relative to the chlorine ions serving as negative fixed charges, and thereby reduces the potential of second nitride semiconductor layer 104. Accordingly, the ohmic contact resistance sufficiently decreases as compared to the background art such as Japanese Unexamined Patent Application Publication No. 2006-351762 or Japanese Patent No. 6018809.

The silicon concentration is higher than the chlorine concentration within the narrow range, the depth of 30 nm of contact layer 105. This reduces scattering of electrons caused by the silicon and chlorine, while reducing the potential of the entire region of contact layer 105 within this depth of 30 nm. Accordingly, the ohmic contact resistance further decreases.

Setting of the peak value of the chlorine concentration in contact layer 105 to $1 \times 10^{18}$ cm$^{-3}$ or higher further promotes the activation of silicon. On the other hand, setting of the chlorine concentration to $1 \times 10^{17}$ cm$^{-3}$ or lower between the lower surface of contact layer 105 and the heterointerface reduces an increase in the potential of second nitride semiconductor layer 104. Accordingly, the ohmic contact resistance further decreases.

Figure 3:
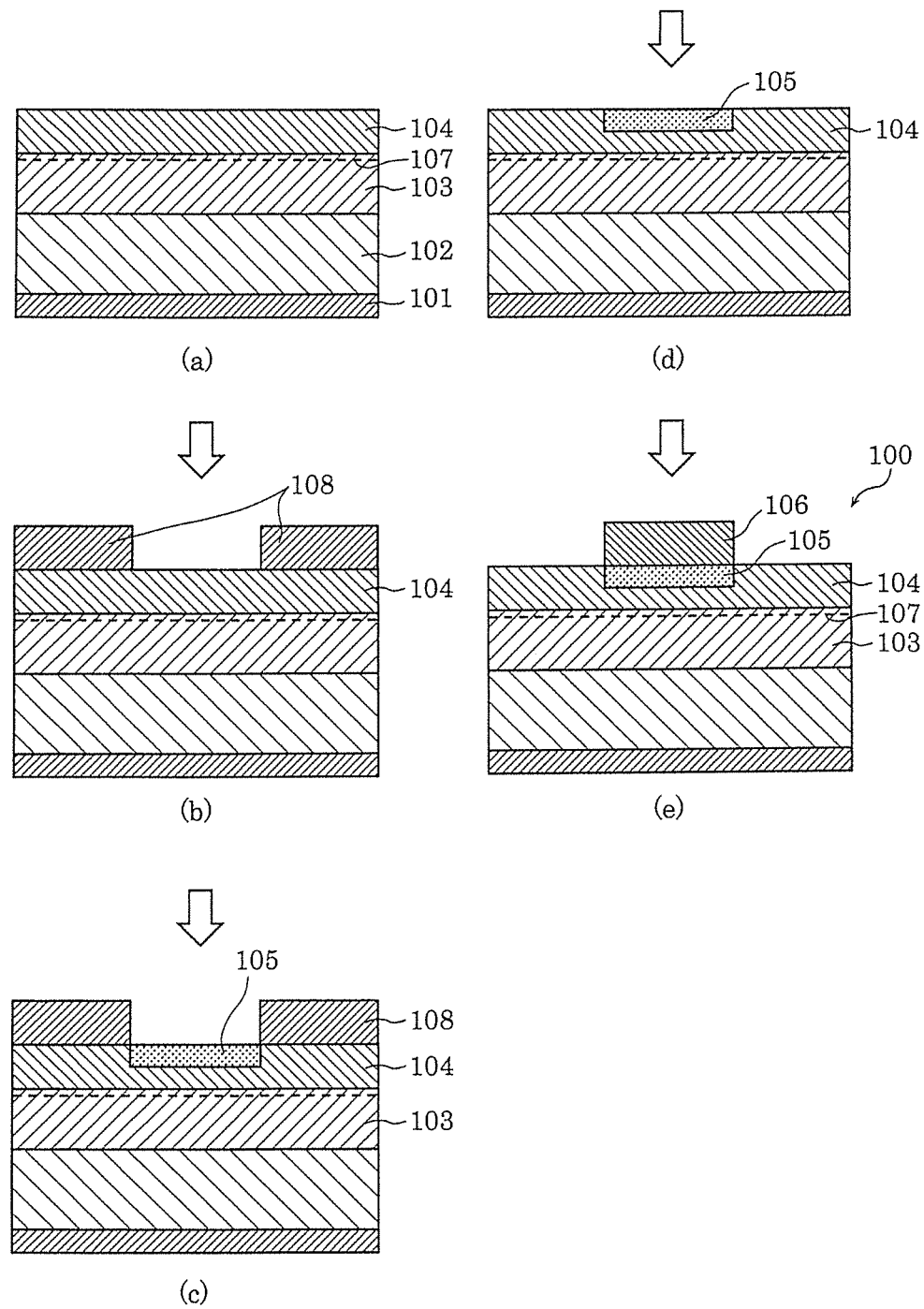
FIG. 3 is a cross-sectional view illustrating steps of a method of manufacturing the semiconductor device according to Embodiment 1.

Now, a method of manufacturing semiconductor device 100 according to this embodiment will be described with reference to FIG. 3. FIG. 3 is a cross-sectional view illustrating steps of the method of manufacturing semiconductor device 100 according to this embodiment.

First, as shown in (a) of FIG. 3, buffer layer 102, first nitride semiconductor layer 103, and second nitride semiconductor layer 104 are sequentially epitaxially grown on substrate 101 of Si by metal organic chemical vapor deposition (MOCVD). Buffer layer 102 has a thickness of 2 μm and a multilayer structure of AlN and AlGaN. First nitride semiconductor layer 103 has a thickness of 2 μm and is made of i-GaN. Second nitride semiconductor layer 104 has a thickness of 60 nm and is made of i-AlGaN containing 15% of Al. As a result, 2DEG 107 is generated at the heterointerface between first nitride semiconductor layer 103 and second nitride semiconductor layer 104.

Next, as shown in (b) of FIG. 3, insulating film 108 of SiN with a thickness of 100 nm is deposited on second nitride semiconductor layer 104 by plasma CVD. Lithography and wet etching with a hydrofluoric acid are then performed sequentially in the region to be formed with contact layer 105 to form, in insulating film 108, an opening that reaches second nitride semiconductor layer 104. This allows formation of insulating film 108 patterned in a predetermined shape as a mask for forming contact layer 105. While SiN is formed as the mask in this embodiment, SiO$_2$ or a resist may be formed as the mask.

After that, as shown in (c) of FIG. 3, plasma treatment containing SiCl$_4$ gas is performed by an inductively coupled plasma (ICP) dry etching system using, as a mask, insulating film 108 with the opening. Contact layer (contact region) 105 is then formed as a contact region containing silicon and chlorine in the upper layer part of second nitride semiconductor layer 104. As a specific example, plasma treatment using the ICP dry etching system will be described in this embodiment. Alternatively, plasma treatment may be performed using a capacitively coupled plasma (CCP) or electron cyclotron resonance (ECR) dry etching system.

The plasma treatment is performed by the ICP dry etching system using, for example, SiCl$_4$ as a gas material. The SiCl$_4$ gas is introduced at a flow rate of 10 sccm to 30 sccm. At this time, SiH$_4$ as a silicon (Si)-containing material and/or Cl$_2$, BCl$_3$, or CCl as a chlorine-containing material may be added in addition to SiCl$_4$. Alternatively, argon (Ar) or helium (He) being inert gas may be introduced to dilute SiCl$_4$ to about 5% of the total. The plasma treatment is performed under the following set conditions, for example. The plasma treatment atmosphere has a pressure within a range from 0.5 Pa to 3 Pa. A power supply with 13.56 MHz feeds power within a range from 50 W to 200 W to an upper electrode. The power supply with 13.56 MHz feeds power within a range from 20

W to 50 W to a lower electrode. The substrate has a temperature within a range from 0° C. to 20° C. The duration of the treatment is from 30 seconds to 120 seconds.

The plasma treatment containing the $SiCl_4$ gas according to this embodiment corresponds to ion implantation at an ultra-low acceleration voltage. The plasma treatment implants high concentration silicon and chlorine ions into a shallow region of second nitride semiconductor layer 104 within 30 nm from the surface. The chlorine concentration decreases to $1 \times 10^{17}$ $cm^{-3}$ or lower between the lower surface of contact layer 105 and the heterointerface.

Atomic mass number 14 of silicon is smaller than atomic mass number 17 of chlorine, and silicon ions can be thus implanted more deeply than chlorine ions. Unlike silicon, chlorine is volatilized as a reaction product of $GaCl_4$. The silicon concentration is thus reliably higher than the chlorine concentration in the impurity concentration distribution along the depth of contact layer 105.

In the plasma treatment, the ions are incident not only vertically but also obliquely, and the silicon concentration is higher than the chlorine concentration in contact layer 105 in a plan view. In the plasma treatment, the conditions may be adjusted such that the chlorine concentration is $1 \times 10^{18}$ $cm^{-3}$ or higher.

In this embodiment, contact layer 105 is formed in second nitride semiconductor layer 104 by the plasma treatment containing the $SiCl_4$ gas. Alternatively, contact layer 105 may be formed in second nitride semiconductor layer 104 by an ion implanter with a low acceleration voltage.

Next, the polymer deposited during the formation of contact layer 105 is removed by a polymer cleaning agent and then first thermal treatment is performed for one minute under a nitrogen atmosphere at a temperature of 800° C. to activate the silicon ions of contact layer 105.

To activate the silicon ions, the thermal treatment is typically performed at a temperature of 1000° C. or higher. In this embodiment, however, the first thermal treatment is performed at a temperature of 900° C. or lower. This reduces scattering of chlorine in contact layer 105 and sets the chlorine concentration to $1 \times 10^{17}$ $cm^{-3}$ or lower between the lower surface of contact layer 105 and the heterointerface. Note that the first thermal treatment may be performed at a temperature ranging from 450° C. to 900° C. The first thermal treatment may be set to a time as short as possible but necessary and sufficient to activate silicon.

After that, as shown in (d) of FIG. 3, insulating film 108 is completely removed by wet etching using a hydrofluoric acid. In this embodiment, insulating film 108 is completely removed by the wet etching using the hydrofluoric acid after the first thermal treatment. Insulating film 108 may be removed before the first thermal treatment.

Next, as shown in (e) of FIG. 3, pre-cleaning is performed using hydrochloric acid, and the Ti film and the Al film are sequentially deposited by sputtering. Lithography and dry etching are then sequentially performed to pattern the multilayer of the Ti film and the Al film. Accordingly, ohmic electrode 106 is formed in a predetermined shape on contact layer 105. Alternatively, ohmic electrode 106 may be formed in the predetermined shape by sequentially performing lithography and lift-off, after sequentially depositing the Ti film and the Al film not by the sputtering but by vapor deposition.

Second thermal treatment is then performed for one minute under a nitrogen atmosphere at a temperature of 500° C. to form ohmic contact between ohmic electrode 106 and 2DEG 107. At this time, the second thermal treatment is performed at a temperature of 900° C. or lower in this embodiment. This reduces scattering of chlorine in contact layer 105 and sets the chlorine concentration to $1 \times 10^{17}$ $cm^{-3}$ or lower between the lower surface of contact layer 105 and the heterointerface. In view of reducing the scattering of the chlorine, the second thermal treatment may be performed at a lower temperature than in the first thermal treatment for a time as short as possible but necessary and sufficient to alloy ohmic electrode 106.

Through the series of steps, semiconductor device 100 with the configuration shown in FIG. 1 is complete. Semiconductor device 100 configured as described above reduces the ohmic contact resistance from about 1.0 Ω·mm to about 0.3 Ω·mm or lower.

An example has been described in this embodiment where second nitride semiconductor layer 104 has the thickness of 60 nm. If second nitride semiconductor layer 104 has a thickness of 20 nm, for example, contact layer 105 may reach the heterointerface between first nitride semiconductor layer 103 and second nitride semiconductor layer 104. This configuration increases the carrier concentration in 2DEG 107 and thus further reduces the ohmic contact resistance.

In this embodiment, an end of ohmic electrode 106 is flush with an end of contact layer 105 or protrudes beyond the end of contact layer 105 in a plan view. In this case, the silicon concentration may be higher than the chlorine concentration within 30 nm from the end of contact layer 105 in the plan view. This configuration reduces the potential in second nitride semiconductor layer 104 relative to an oblique current path at the end of contact layer 105 and thus further reduces the ohmic contact resistance.

Figure 10:
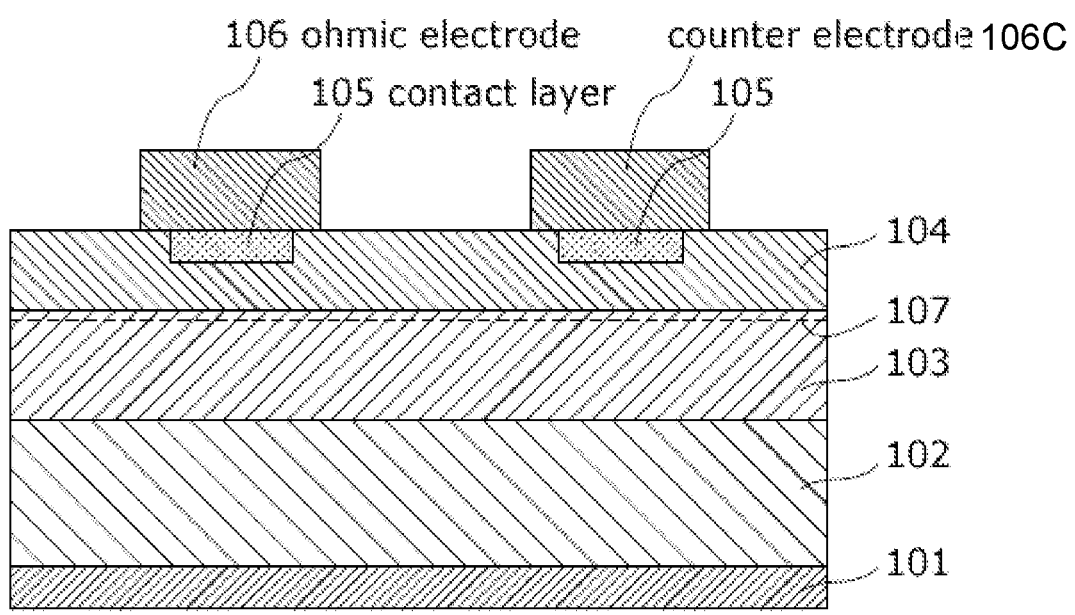
FIG. 10 is a cross-sectional view illustrating a configuration of a semiconductor device according to an embodiment of the present disclosure.

In this embodiment shown in FIG. 10, assume that a high voltage is applied between ohmic electrode 106 and a counter electrode 106C. If the counter electrode exists, ohmic electrode 106 may protrude beyond contact layer 105 toward the counter electrode in the plan view. This configuration reduces the electric field concentrated at the end of the ohmic electrode and thus reduces the breakage of the device.

Variation 1 of Embodiment 1

Figure 4:
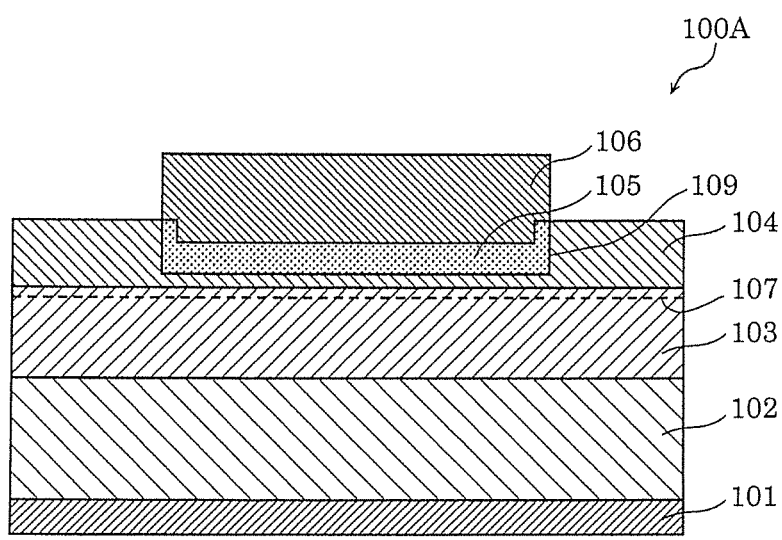
FIG. 4 is a cross-sectional view illustrating a configuration of a semiconductor device according to Variation 1 of Embodiment 1.

Now, a configuration of semiconductor device 100A according to Variation 1 of Embodiment 1 will be described with reference to FIG. 4. FIG. 4 is a cross-sectional view illustrating a configuration of semiconductor device 100A according to Variation 1 of Embodiment 1.

Semiconductor device 100A according to this variation is different from semiconductor device 100 according to Embodiment 1 described above as follows. As shown in FIG. 4, in semiconductor device 100A according to this variation, at least a part of the lower surface of ohmic electrode 106 is formed on recess (i.e., recessed region) 109. Recess 109 is formed by partially removing second nitride semiconductor layer 104.

Specifically, recess 109 is recessed halfway along the depth of second nitride semiconductor layer 104. The depth of recess 109 may be 10 nm, for example.

Ohmic electrode 106 is formed so that a part of the lower surface of ohmic electrode 106 is located on recess 109 and another part (each end in FIG. 4) of the lower surface of ohmic electrode 106 is formed on the part of second nitride semiconductor layer 104 other than recess 109. In this variation as well, ohmic electrode 106 is electrically connected to 2DEG 107 through contact layer 105 at the bottom of ohmic electrode 106.

In this manner, the configuration of semiconductor device 100A according to this variation eliminates damages of the surface in the step of forming second nitride semiconductor layer 104 and reduces the thickness of second nitride semiconductor layer 104. Accordingly, the ohmic contact resistance further decreases as compared to semiconductor device 100 according to Embodiment 1.

Figure 5:
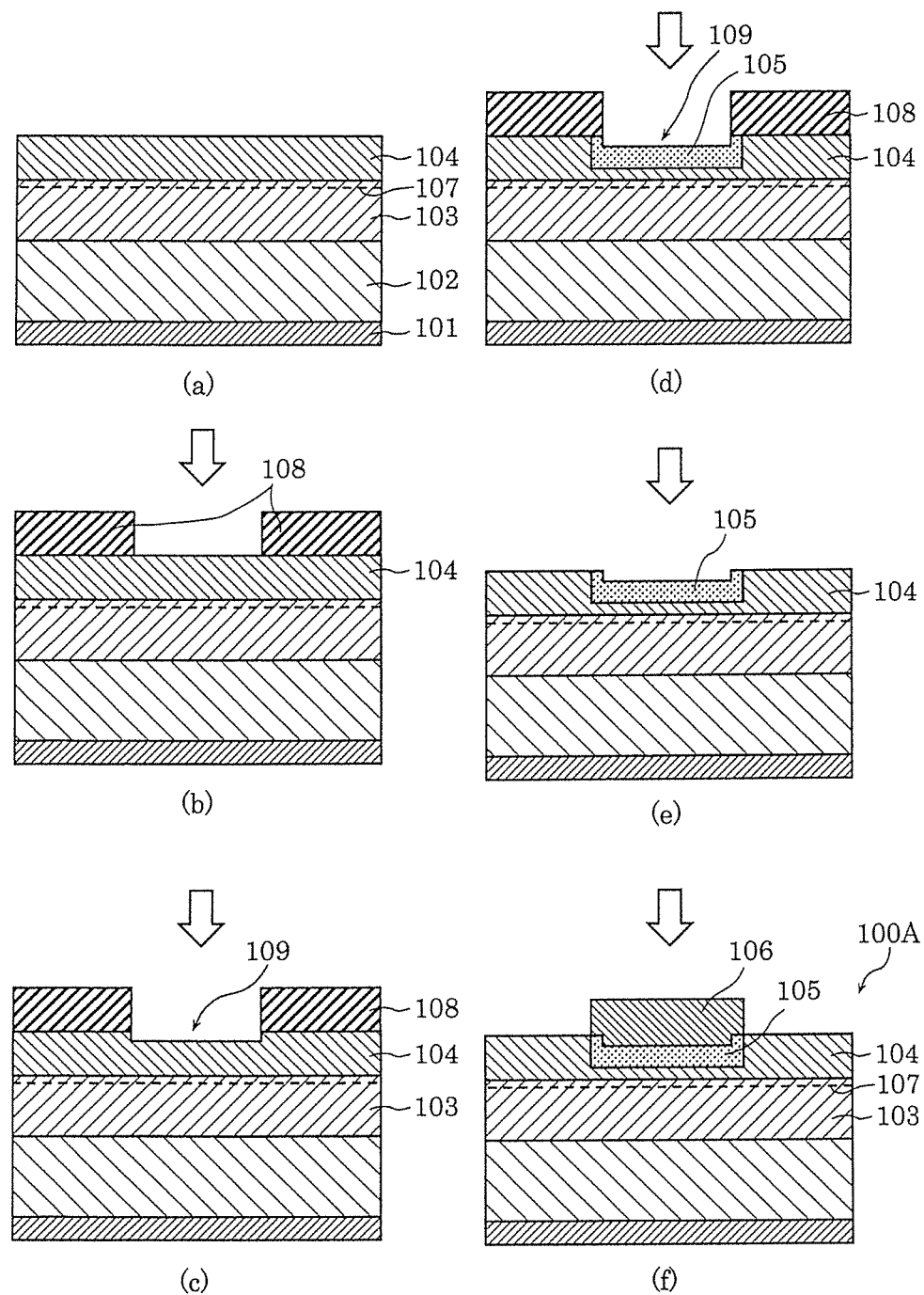
FIG. 5 is a cross-sectional view illustrating steps of a method of manufacturing the semiconductor device according to Variation 1 of Embodiment 1.

Now, a method of manufacturing semiconductor device 100A according to this variation will be described with reference to FIG. 5. FIG. 5 is a cross-sectional view illustrating steps of the method of manufacturing semiconductor device 100A according to this variation. The method of manufacturing semiconductor device 100A according to this variation is performed in accordance with the method of manufacturing semiconductor device 100 according to Embodiment 1 described above.

First, as shown in (a) of FIG. 5, buffer layer 102, first nitride semiconductor layer 103, and second nitride semiconductor layer 104 are sequentially epitaxially grown on substrate 101 of Si by MOCVD. Buffer layer 102 has a thickness of 2 µm and a multilayer structure of AlN and AlGaN. First nitride semiconductor layer 103 has a thickness of 2 µm and is made of i-GaN. Second nitride semiconductor layer 104 has a thickness of 60 nm and is made of i-AlGaN containing 15% of Al. As a result, 2DEG 107 is generated at the heterointerface between first nitride semiconductor layer 103 and second nitride semiconductor layer 104.

Next, as shown in (b) of FIG. 5, insulating film 108 of SiN with a thickness of 100 nm is deposited on second nitride semiconductor layer 104 by plasma CVD. Lithography and wet etching with a hydrofluoric acid are then performed sequentially in the region to be formed with contact layer 105 to form, in insulating film 108, an opening that reaches second nitride semiconductor layer 104. This allows formation of insulating film 108 patterned in a predetermined shape as a mask for forming contact layer 105. In this variation as well, $SiO_2$ or a resist may be formed as the mask instead of SiN.

After that, as shown in (c) of FIG. 5, dry etching is performed by an ICP dry etching system using, as a mask, insulating film 108 with the opening. Second nitride semiconductor layer 104 is etched 10 nm to form recess 109 with a depth of 10 nm in second nitride semiconductor layer 104. The dry etching treatment is performed using, for example, $Cl_2$ as etching gas. The $Cl_2$ gas is supplied at a flow rate of 10 sccm to 50 sccm. At this time, $BCl_3$, CCl, or $SiCl_4$ as a chlorine-containing material may be added in addition to $Cl_2$. The dry etching treatment is performed under the following set conditions, for example. The plasma treatment atmosphere has a pressure within a range from 0.5 Pa to 1 Pa. A power supply with 13.56 MHz feeds power within a range from 50 W to 200 W to an upper electrode. The power supply with 13.56 MHz feeds power within a range from 10 W to 50 W to a lower electrode. The substrate has a temperature within a range from 0° C. to 20° C.

Then, as shown in (d) of FIG. 5, plasma treatment containing $SiCl_4$ gas is performed by an ICP dry etching system continuously using insulating film 108 as a mask. Contact layer 105 is then formed in the upper layer part of second nitride semiconductor layer 104. As a specific example, plasma treatment using the ICP dry etching system will be described in this variation. Alternatively, plasma treatment may be performed using a CCP or ECR dry etching system.

The plasma treatment is performed by the ICP dry etching system using, for example, $SiCl_4$ as a gas material. The $SiCl_4$ gas is introduced at a flow rate of 10 sccm to 30 sccm. At this time, $SiH_4$ as a silicon-containing material and/or $Cl_2$, $BCl_3$, or CCl as a chlorine-containing material may be added in addition to $SiCl_4$. Alternatively, argon (Ar) or helium (He) being inert gas may be introduced to dilute $SiCl_4$ to about 5% of the total. The plasma treatment is performed under the following set conditions, for example. The plasma treatment atmosphere has a pressure within a range from 0.5 Pa to 3 Pa. A power supply with 13.56 MHz feeds power within a range from 50 W to 200 W to an upper electrode. The power supply with 13.56 MHz feeds power within a range from 10 W to 50 W to a lower electrode. The substrate has a temperature within a range from 0° C. to 20° C. The duration of the treatment is from 30 seconds to 120 seconds.

In this variation, contact layer 105 is formed by the plasma treatment containing the $SiCl_4$ gas after the formation of recess 109. Alternatively, contact layer 105 may be formed first by the plasma treatment containing the $SiCl_4$ gas and then recess 109 may be formed. At the same time as the plasma treatment containing the $SiCl_4$ gas, recess 109 may be formed. How to form recess 109 is not particularly limited.

Next, the polymer deposited during the formation of recess 109 and contact layer 105 is removed by a polymer cleaning agent and then first thermal treatment is performed for one minute under a nitrogen atmosphere at a temperature of 800° C. to activate the silicon ions of contact layer 105. In this variation, the first thermal treatment is performed at a temperature of 900° C. or lower. This reduces scattering of chlorine in contact layer 105 so that the chlorine concentration is $1 \times 10^{17}$ $cm^{-3}$ or lower between the lower surface of contact layer 105 and the heterointerface.

After that, as shown in (e) of FIG. 5, insulating film 108 is completely removed by wet etching using a hydrofluoric acid.

As shown in (f) of FIG. 5, pre-cleaning is performed using hydrochloric acid, and the Ti film and the Al film are sequentially deposited by sputtering. Lithography and dry etching are then sequentially performed to pattern the multilayer of the Ti film and the Al film. Accordingly, ohmic electrode 106 is formed in a predetermined shape on contact layer 105.

Second thermal treatment is then performed for one minute under a nitrogen atmosphere at a temperature of 500° C. to form ohmic contact between ohmic electrode 106 and 2DEG 107. At this time, the second thermal treatment is performed at a temperature of 900° C. or lower in this variation. This reduces scattering of chlorine in contact layer 105 and sets the chlorine concentration to $1 \times 10^{17}$ $cm^{-3}$ or lower between the lower surface of contact layer 105 and the heterointerface.

Through the series of steps, semiconductor device 100A with the configuration shown in FIG. 4 is complete. Semiconductor device 100A configured as described above reduces the ohmic contact resistance from about 1.0 Ω·mm to about 0.3 Ω·mm or lower.

In this variation, ohmic electrode 106 is formed so that a part of the lower surface of ohmic electrode 106 is located on recess 109 and the other part of the lower surface of ohmic electrode 106 is located in the part other than recess 109. Alternatively, the entire lower surface of ohmic electrode 106 may be formed on recess 109.

In this variation, second nitride semiconductor layer 104 is removed by 10 nm to form recess 109. Alternatively, second nitride semiconductor layer 104 may be removed by, for example, 40 nm to form recess 109 so that contact layer 105 reaches the heterointerface between first nitride semiconductor layer 103 and second nitride semiconductor layer 104. This configuration increases the carrier concentration in 2DEG 107 and thus further reduces the ohmic contact resistance.

Variation 2 of Embodiment 1

Figure 6:
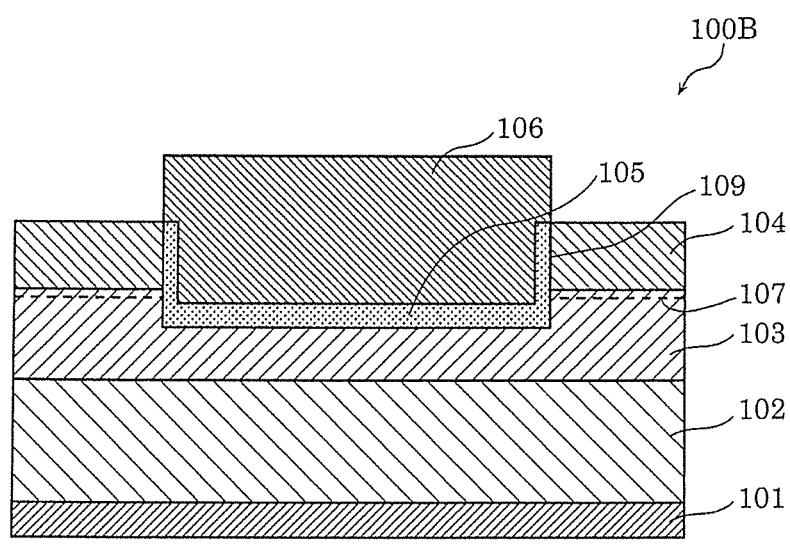
FIG. 6 is a cross-sectional view illustrating a configuration of a semiconductor device according to Variation 2 of Embodiment 1.

Now, a configuration of semiconductor device 100B according to Variation 2 of Embodiment 1 will be described with reference to FIG. 6. FIG. 6 is a cross-sectional view illustrating the configuration of semiconductor device 100B according to Variation 2 of Embodiment 1.

Semiconductor device 100B according to this variation is different from semiconductor device 100 according to Embodiment 1 described above as follows. As shown in FIG. 6, in semiconductor device 100B according to this variation, at least a part of the lower surface of ohmic electrode 106 is formed on recess (recessed region) 109. Recess 109 is formed by removing the entire region of second nitride semiconductor layer 104 and a part of first nitride semiconductor layer 103 under ohmic electrode 106. With this configuration, ohmic electrode 106 is electrically connected to 2DEG 107 through contact layer 105 not only at the bottom of ohmic electrode 106 but also on the side surfaces of ohmic electrode 106.

Recess 109 is formed from second nitride semiconductor layer 104 to reach first nitride semiconductor layer 103. Specifically, recess 109 is recessed along the entire depth of second nitride semiconductor layer 104 and halfway along the depth of first nitride semiconductor layer 103. The depth of recess 109 is 80 nm, for example.

Ohmic electrode 106 is formed so that a part of the lower surface of ohmic electrode 106 is located on recess 109 and the other part (each end in FIG. 4) of the lower surface of ohmic electrode 106 located on the region of second nitride semiconductor layer 104 other than recess 109.

In this manner, the configuration of semiconductor device 100B according to this variation requires no current path through second nitride semiconductor layer 104 or reduces the effective thickness of second nitride semiconductor layer 104 in the current path. Accordingly, the ohmic contact resistance further decreases as compared to semiconductor device 100A according to Variation 1 of Embodiment 1.

Figure 7:
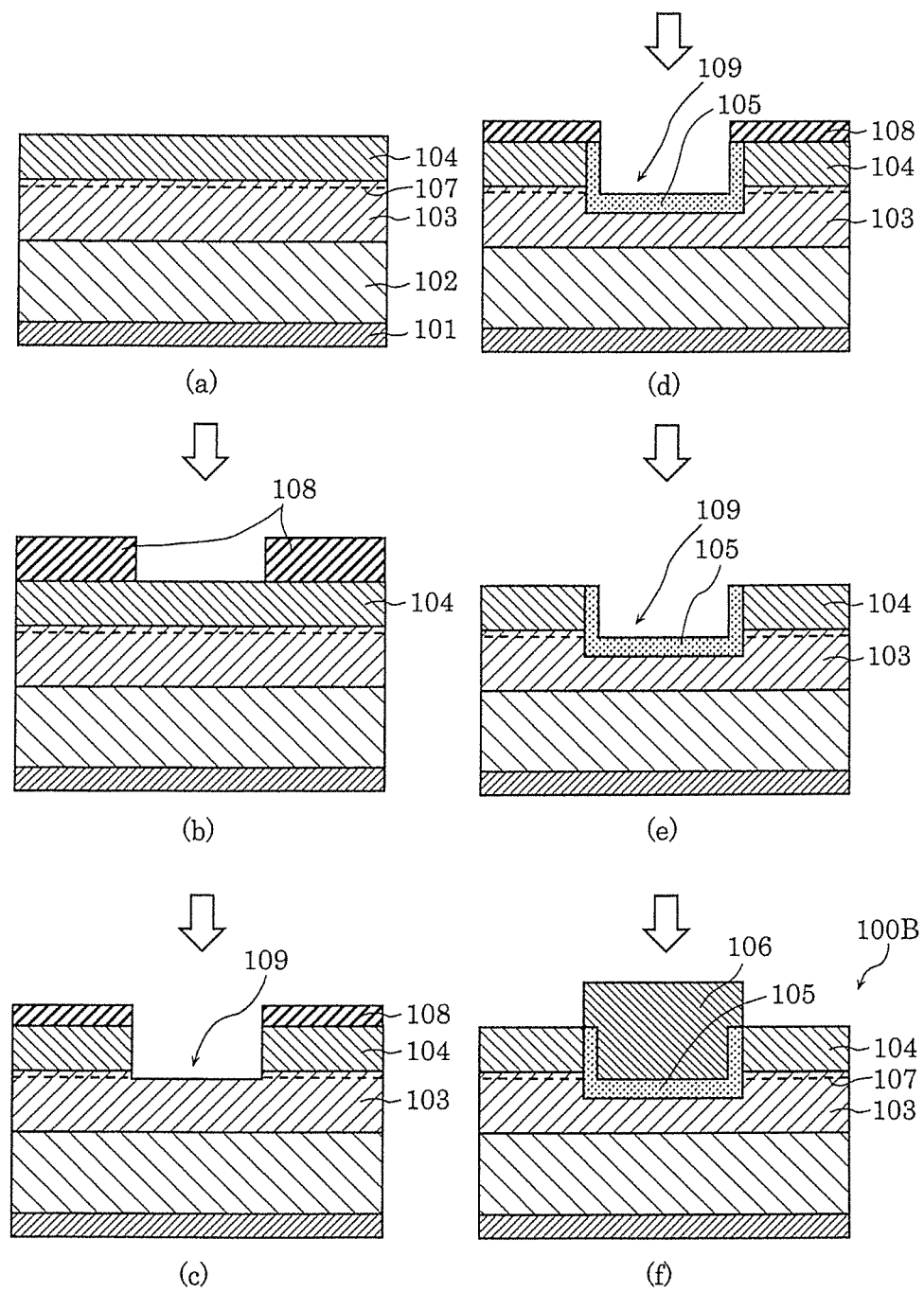
FIG. 7 is a cross-sectional view illustrating steps of a method of manufacturing the semiconductor device according to Variation 2 of Embodiment 1.

Now, a method of manufacturing semiconductor device 100B according to this variation will be described with reference to FIG. 7. FIG. 7 is a cross-sectional view illustrating steps of the method of manufacturing semiconductor device 100B according to this variation. The method of manufacturing semiconductor device 100B according to this variation is performed in accordance with the method of manufacturing semiconductor device 100A according to Variation 1 of Embodiment 1 described above. First, as shown in (a) of FIG. 7, buffer layer 102, first nitride semiconductor layer 103, and second nitride semiconductor layer 104 are sequentially epitaxially grown on substrate 101 of Si by MOCVD. Buffer layer 102 has a thickness of 2 μm and a multilayer structure of AlN and AlGaN. First nitride semiconductor layer 103 has a thickness of 2 μm and is made of i-GaN. Second nitride semiconductor layer 104 has a thickness of 60 nm and is made of i-AlGaN containing 15% of Al. As a result, 2DEG 107 is generated at the heterointerface between first nitride semiconductor layer 103 and second nitride semiconductor layer 104.

Next, as shown in (b) of FIG. 7, insulating film 108 of SiN with a thickness of 100 nm is deposited on second nitride semiconductor layer 104 by plasma CVD. Lithography and wet etching with a hydrofluoric acid are then performed sequentially in the region to be formed with contact layer 105 to form, in insulating film 108, an opening that reaches second nitride semiconductor layer 104. This allows formation of insulating film 108 patterned in a predetermined shape as a mask for forming contact layer 105. In this variation as well, $SiO_2$ or a resist may be formed as the mask instead of SiN.

After that, as shown in (c) of FIG. 7, dry etching is performed by an ICP dry etching system using, as a mask, insulating film 108 with the opening. Entire second nitride semiconductor layer 104 and a part of first nitride semiconductor layer 103 are etched to form recess 109 with a depth of 80 nm. The dry etching treatment is performed using, for example, $Cl_2$ as etching gas. The $Cl_2$ gas is supplied at a flow rate of 10 sccm to 50 sccm. At this time, $BCl_3$, CCl, or $SiCl_4$ as a chlorine-containing material may be added in addition to $Cl_2$. The dry etching treatment is performed under the following set conditions, for example. The plasma treatment atmosphere has a pressure within a range from 0.5 Pa to 1 Pa. A power supply with 13.56 MHz feeds power within a range from 50 W to 200 W to an upper electrode. The power supply with 13.56 MHz feeds power within a range from 10 W to 50 W to a lower electrode. The substrate has a temperature within a range from 0° C. to 20° C.

Then, as shown in (d) of FIG. 7, plasma treatment containing $SiCl_4$ gas is performed by an ICP dry etching system continuously using insulating film 108 as a mask. Contact layer 105 is then formed in the upper layer part of first nitride semiconductor layer 103 and the side surfaces of second nitride semiconductor layer 104. As a specific example, plasma treatment using the ICP dry etching system will be described in this variation. Alternatively, plasma treatment may be performed using a CCP or ECR dry etching system.

The plasma treatment is performed by the ICP dry etching system using, for example, $SiCl_4$ as a gas material. The $SiCl_4$ gas is introduced at a flow rate of 10 sccm to 30 sccm. At this time, $SiH_4$ as a silicon-containing material and/or $Cl_2$, $BCl_3$, or CCl as a chlorine-containing material may be added in addition to $SiCl_4$. Alternatively, argon (Ar) or helium (He) being inert gas may be introduced to dilute $SiCl_4$ to about 5% of the total. The plasma treatment is performed under the following set conditions, for example. The plasma treatment atmosphere has a pressure within a range from 0.5 Pa to 3 Pa. A power supply with 13.56 MHz feeds power within a range from 50 W to 200 W to an upper electrode. The power supply with 13.56 MHz feeds power within a range from 10 W to 50 W to a lower electrode. The substrate has a temperature within a range from 0° C. to 20° C. The duration of the treatment is from 30 seconds to 120 seconds.

In this variation, contact layer 105 is formed by the plasma treatment containing the $SiCl_4$ gas after the formation of recess 109. Alternatively, contact layer 105 may be formed first by the plasma treatment containing the $SiCl_4$ gas and then recess 109 may be formed. At the same time as the plasma treatment containing the $SiCl_4$ gas, recess 109 may be formed. How to form recess 109 is not particularly limited.

Next, the polymer deposited during the formation of recess 109 and contact layer 105 is removed by a polymer cleaning agent and then first thermal treatment is performed for one minute under a nitrogen atmosphere at a temperature of 800° C. to activate the silicon ions of contact layer 105. In this variation, the first thermal treatment is performed at a temperature of 900° C. or lower. This reduces scattering of chlorine in contact layer 105.

After that, as shown in (e) of FIG. 7, insulating film 108 is completely removed by wet etching using a hydrofluoric acid.

As shown in (f) of FIG. 7, pre-cleaning is performed using hydrochloric acid, and the Ti film and the Al film are sequentially deposited by sputtering. Lithography and dry etching are then sequentially performed to pattern the multilayer of the Ti film and the Al film. Accordingly, ohmic electrode 106 is formed in a predetermined shape on contact layer 105.

Second thermal treatment is then performed for one minute under a nitrogen atmosphere at a temperature of 500° C. to form ohmic contact between ohmic electrode 106 and 2DEG 107. At this time, the second thermal treatment is performed at a temperature of 900° C. or lower in this variation. This reduces scattering of chlorine in contact layer 105.

Through the series of steps, semiconductor device 100B with the configuration shown in FIG. 6 is complete. Semiconductor device 100B configured as described above reduces the ohmic contact resistance from about 1.0 Ω·mm to about 0.3 Ω·mm or lower.

In this variation, ohmic electrode 106 is formed so that a part of the lower surface of ohmic electrode 106 is located on recess 109 and the other part of the lower surface of ohmic electrode 106 is located in the region other than recess 109. Alternatively, the entire lower surface of ohmic electrode 106 may be formed on recess 109.

Embodiment 2

Figure 8:
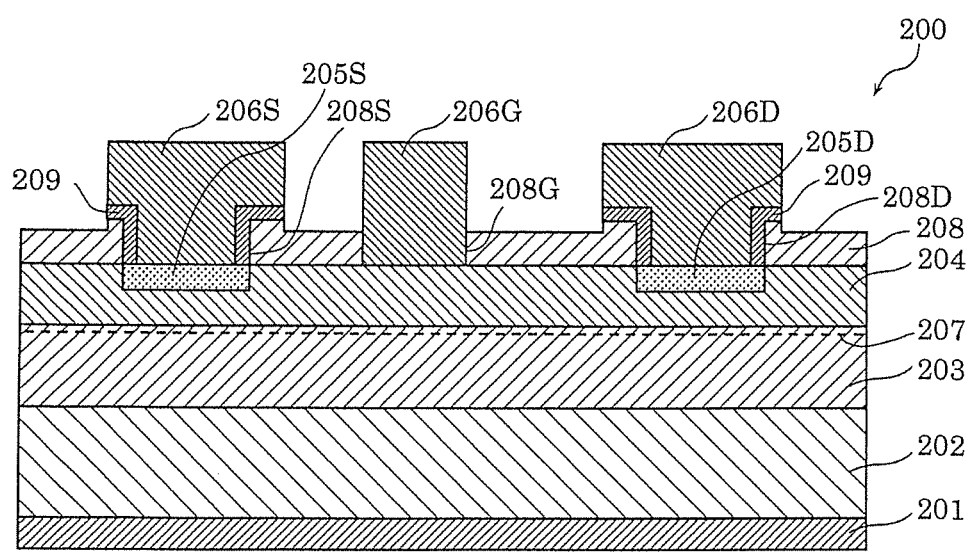
FIG. 8 is a cross-sectional view illustrating a configuration of a semiconductor device according to Embodiment 2.

Now, a configuration of semiconductor device 200 according to Embodiment 2 will be described with reference to FIG. 8. FIG. 8 is a cross-sectional view illustrating the configuration of semiconductor device 200 according to Embodiment 2. This embodiment will be described where semiconductor device 200 is a heterojunction field-effect transistor (HFET).

As shown in FIG. 8, semiconductor device 200 includes substrate 201, buffer layer 202, first nitride semiconductor layer 203, second nitride semiconductor layer 204, contact layers 205S and 205D, source electrode 206S, drain electrode 206D, gate electrode 206G, insulating film 208, and insulating layer 209.

Like substrate 101 according to Embodiment 1, substrate 201 may be made of Si, for example, but may also be sapphire, SiC, GaN, or AlN, for example.

Buffer layer 202 is formed on substrate 201. Like buffer layer 102 according to Embodiment 1, buffer layer 202 may be a nitride semiconductor layer, for example, with a thickness of 2 μm and a multilayer structure of AlN and AlGaN. Buffer layer 202 may be made of another group-III nitride semiconductor.

First nitride semiconductor layer 203 is formed above substrate 201. Specifically, first nitride semiconductor layer 203 is formed on buffer layer 202. Like first nitride semiconductor layer 103 according to Embodiment 1, first nitride semiconductor layer 203 may have a thickness of 2 μm and may be made of undoped (i-)GaN. First nitride semiconductor layer 203 may be made of another group-III nitride semiconductor.

Second nitride semiconductor layer 204 is formed on first nitride semiconductor layer 203. Like second nitride semiconductor layer 104 according to Embodiment 1, second nitride semiconductor layer 204 may have a thickness of 60 nm and may be made of undoped (i-)AlGaN containing 15% of Al. Second nitride semiconductor layer 204 may be made of another group-III nitride semiconductor.

In this embodiment as well, second nitride semiconductor layer 204 has a wider band gap than first nitride semiconductor layer 203. Second nitride semiconductor layer 204 and first nitride semiconductor layer 203 form a heterostructure. That is, the interface between second nitride semiconductor layer 204 and first nitride semiconductor layer 203 is a heterojunction. In first nitride semiconductor layer 203 at the heterointerface between second nitride semiconductor layer 204 and first nitride semiconductor layer 203, 2DEG 207 is generated to form a 2DEG channel.

Insulating film 208 is formed on second nitride semiconductor layer 204. Insulating film 208 is made of SiN, for example. Insulating film 208 includes source electrode opening 208S and drain electrode opening 208D reaching second nitride semiconductor layer 204.

Contact layer (first contact layer) 205S is formed as a contact region, in second nitride semiconductor layer 204 in the position corresponding to source electrode opening 208S. Contact layer 205S is formed in the upper layer part of second nitride semiconductor layer 204 in contact with at least a part of source electrode 206S. In this embodiment, contact layer 205S is formed right under source electrode 206S.

On the other hand, contact layer (second contact layer) 205D is formed as a contact region, in second nitride semiconductor layer 204 in the position corresponding to drain electrode opening 208D. Contact layer 205D is formed in the upper layer part of second nitride semiconductor layer 204 in contact with at least a part of drain electrode 206D. In this embodiment, contact layer 205D is formed right under drain electrode 206D.

Each of contact layer 205S and contact layer 205D contains silicon and chlorine. The concentrations and distributions of silicon and chlorine in contact layer 205S and contact layer 205D are the same or similar to those in contact layer 105 according to Embodiment 1 described above.

Source electrode 206S is formed in the position corresponding to source electrode opening 208S, whereas drain electrode 206D is formed in the position corresponding to drain electrode opening 208D. Source electrode 206S and drain electrode 206D are ohmic electrodes above substrate 201. Specifically, source electrode 206S is formed on contact layer 205S to cover source electrode opening 208S. Drain electrode 206D is formed on contact layer 205D to cover drain electrode opening 208D.

In this embodiment, source electrode 206S and drain electrode 206D are multilayer electrode films formed by sequentially stacking a Ti film and an Al film, for example, like ohmic electrode 106 according to Embodiment 1. The configurations are however not limited thereto.

Source electrode 206S and drain electrode 206D are electrically connected to 2DEG 207. Specifically, source electrode 206S is electrically connected to 2DEG 207 through contact layer 205S at from the bottom of source electrode 206S. Drain electrode 206D is electrically connected to 2DEG 207 through contact layer 205D at the bottom of drain electrode 206D.

Insulating layer 209 is formed between each of source electrode 206S and drain electrode 206D and insulating film 208. Insulating layer 209 is formed in the upper layer part of insulating film 208. That is, insulating film 208 includes, as a part, insulating layer 209 containing chlorine. In this embodiment, the peak value of the chlorine concentration may be $1\times10^{18}$ cm$^{-3}$ or higher in insulating layer 209.

Insulating film 208 further has gate electrode opening 208G reaching second nitride semiconductor layer 204. Gate electrode 206G is formed in the position corresponding to gate electrode opening 208G. Specifically, gate electrode 206G covers gate electrode opening 208G. Gate electrode 206G is in contact with second nitride semiconductor layer 204 with no contact layer interposed therebetween. Gate electrode 206G is in Schottky contact with second nitride semiconductor layer 204. Gate electrode 206G has a multilayer film structure formed by sequentially stacking a Ni film and an Au film, for example. The configuration is however not limited thereto.

Semiconductor device 200 with such configuration reduces the ohmic contact resistance, while reducing current collapse. The reasons will now be described.

The interface state of insulating layer 209 containing chlorine is broken at the shock when an element is introduced by ion implantation. In addition, chlorine serves as negative fixed charges in the form of chlorine ions and thus increases the potential at the interface. This reduces electrons trapped at the interface between each of source electrode 206S and drain electrode 206D and insulating layer 209 containing chlorine. Current collapse thus decreases when a high voltage is applied between source electrode 206S and drain electrode 206D.

Employment of insulating layer 209 containing chlorine may cause a decrease in the adhesion between insulating layer 209 and other films or in the breakdown voltage. To address the problem, the chlorine concentration in the part other than the region under source electrode 206S and drain electrode 206D may be lower than those under source electrode 206S and drain electrode 206D.

Figure 9:
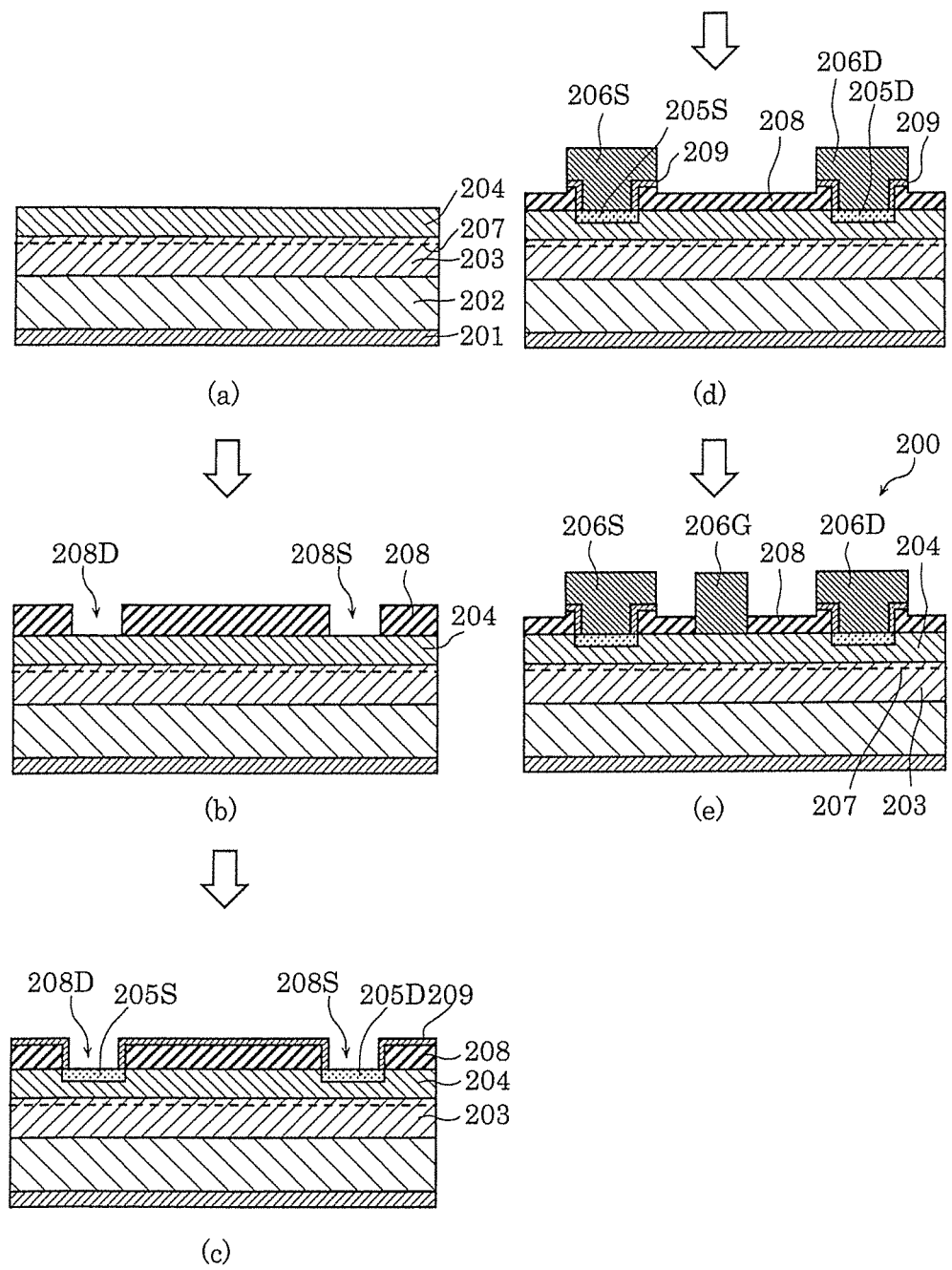
FIG. 9 is a cross-sectional view illustrating steps of a method of manufacturing the semiconductor device according to Embodiment 2.

Now, a method of manufacturing semiconductor device 200 according to this embodiment will be described with reference to FIG. 9. FIG. 9 is a cross-sectional view illustrating steps of the method of manufacturing semiconductor device 200 according to this embodiment.

First, as shown in (a) of FIG. 9, buffer layer 202, first nitride semiconductor layer 203, and second nitride semiconductor layer 204 are sequentially epitaxially grown on substrate 201 of Si by MOCVD like in Embodiment 1 described above. Buffer layer 202 has a thickness of 2 μm and a multilayer structure of AN and AlGaN. First nitride semiconductor layer 203 has a thickness of 2 μm and is made of i-GaN. Second nitride semiconductor layer 204 has a thickness of 60 nm and is made of i-AlGaN containing 15% of Al. As a result, 2DEG 207 is generated at the heterointerface between first nitride semiconductor layer 203 and second nitride semiconductor layer 204.

Next, as shown in (b) of FIG. 9, insulating film 208 of SiN with a thickness of 100 nm is deposited on second nitride semiconductor layer 204 by plasma CVD. Lithography and wet etching with a hydrofluoric acid are then performed sequentially in the region to be formed with contact layers 205S and 205D to form, in insulating film 208, source electrode opening 208S and drain electrode opening 208D as openings reaching second nitride semiconductor layer 204.

After that, as shown in (c) of FIG. 9, plasma treatment containing $SiCl_4$ gas is performed by an ICP dry etching system using, as a mask, insulating film 108 with source electrode opening 208S and drain electrode opening 208D. Contact layers 205S and 205D are then formed as contact regions containing silicon and chlorine in the upper layer parts of second nitride semiconductor layer 204. In addition, insulating layer 209 is formed as a chlorine-containing region in the upper layer part of insulating film 208.

This plasma treatment is performed using, for example, $SiCl_4$ as a gas material. The $SiCl_4$ gas is introduced at a flow rate of 10 sccm to 30 sccm. At this time, $SiH_4$ as a silicon-containing material and/or $Cl_2$, $BCl_3$, or $CCl$ as a chlorine-containing material may be added in addition to $SiCl_4$. Alternatively, argon (Ar) or helium (He) being inert gas may be introduced to dilute $SiCl_4$ to about 5% of the total. The plasma treatment is performed under the following set conditions, for example. The plasma treatment atmosphere has a pressure within a range from 0.5 Pa to 3 Pa. A power supply with 13.56 MHz feeds power within a range from 50 W to 200 W to an upper electrode. The power supply with 13.56 MHz feeds power within a range from 20 W to 50 W to a lower electrode. The substrate has a temperature within a range from 0° C. to 20° C. The duration of the treatment is from 30 seconds to 120 seconds.

In this embodiment, contact layers 205S and 205D and insulating layer 209 containing chlorine are formed in second nitride semiconductor layer 204 by the plasma treatment containing the $SiCl_4$ gas. Alternatively, contact layers 205S and 205D and insulating layer 209 containing chlorine may be formed in second nitride semiconductor layer 204 by an ion implanter with a low acceleration voltage. In the step of performing the plasma treatment, the conditions may be adjusted such that the chlorine concentration is $1 \times 10^{18}$ cm$^{-3}$ or higher in contact layers 205S and 206D.

Next, the polymer deposited during the formation of contact layers 205S and 205D and insulating layer 209 containing chlorine is removed by a polymer cleaning agent and then first thermal treatment is performed for one minute under a nitrogen atmosphere at a temperature of 800° C. to activate the silicon ions of contact layers 205S and 205D.

At this time, in this embodiment, the first thermal treatment is performed at a temperature of 900° C. or lower. This reduces scattering of chlorine in contact layers 205S and 205D and sets the chlorine concentration to $1 \times 10^{17}$ cm$^{-3}$ or lower between the lower surfaces of contact layers 205S and 205D and the heterointerface. Note that the first thermal treatment may be performed at a temperature ranging from 450° C. to 900° C. The first thermal treatment may be set to a time as short as possible but necessary and sufficient to activate silicon. The thermal treatment of insulating film 208 as in this embodiment reduces the reaction of insulating film 208 and insulating layer 209 containing chlorine with source electrode 206S and drain electrode 206D at the second thermal treatment.

Next, as shown in (d) of FIG. 9, pre-cleaning is performed using hydrochloric acid, and the Ti film and the Al film are sequentially deposited by sputtering. Lithography and dry etching are then sequentially performed to pattern the multilayer of the Ti film and the Al film. Accordingly, source electrode 206S and drain electrode 206D in predetermined shapes are, as ohmic electrodes, formed on contact layers 205S and 205D, respectively. At this time, insulating layer 209 is removed by the dry etching in the region other than the parts under source electrode 206S and drain electrode 206D.

Second thermal treatment is then performed for one minute under a nitrogen atmosphere at a temperature of 500° C. to form ohmic contact between source and drain electrodes 206S and 206D and 2DEG 207. At this time, the second thermal treatment is performed at a temperature of 900° C. or lower in this embodiment. This reduces scattering of chlorine in contact layers 205D and 205S.

Next, as shown in (e) of FIG. 9, lithography and wet etching with a hydrofluoric acid are then performed sequentially to form, in insulating film 208, gate electrode opening 208G as an opening that reaches second nitride semiconductor layer 204. The Ti film and the Al film are sequentially deposited by sputtering. Lithography and dry etching are then sequentially performed to pattern the multilayer of the Ti film and the Al film. Accordingly, gate electrode 206G as an ohmic electrode is formed in a predetermined shape on second nitride semiconductor layer 204.

Through the series of steps, semiconductor device 200 with the configuration shown in FIG. 8 is complete. After that, a passivation film, a multilayer interconnect, bonding pads, and other elements may be formed as appropriate in semiconductor device 200. Semiconductor device 200 configured as described above reduces the ohmic contact resistance from about 1.0 Ω·mm to about 0.3 Ω·mm or lower, while reducing current collapse without causing a decrease in the adhesion with the films or in the breakdown voltage.

Other Variations

While only some exemplary embodiments and variations of the present disclosure have been described in detail above, the present disclosure is not limited to embodiments and variations described above.

The present disclosure includes other embodiments, such as those obtained by variously modifying the embodiment as conceived by those skilled in the art or those achieved by freely combining the constituent elements and functions in the embodiment without departing from the scope and spirit of the present disclosure.

INDUSTRIAL APPLICABILITY

The semiconductor device according to the present disclosure is useful for communication systems or inverters requiring high-speed operations and power switching elements used for power supply circuits.

What is claimed is:

1. A semiconductor device, comprising:
a substrate;
a first nitride semiconductor layer above the substrate;
a second nitride semiconductor layer on the first nitride semiconductor layer;
an ohmic electrode above the substrate; and
a contact layer in contact with at least a part of the ohmic electrode, the contact layer containing silicon and chlorine, wherein:
the second nitride semiconductor layer has a wider band gap than the first nitride semiconductor layer,
a two-dimensional electron gas channel is formed in the first nitride semiconductor layer at a heterointerface between the first nitride semiconductor layer and the second nitride semiconductor layer,
in the contact layer, a peak value of a silicon concentration is greater than a peak value of a chlorine concentration, and
each of the silicon concentration and the chlorine concentration in the contact layer gradually decreases from a surface of the contact layer to a depth of 30 nm from the surface of the contact layer.

2. The semiconductor device according to claim 1, wherein
the contact layer is located within a depth of 30 nm from an interface between the ohmic electrode and the contact layer, and
in the contact layer, the silicon concentration is higher than the chlorine concentration.

3. The semiconductor device according to claim 2, wherein
in a plan view, an end of the ohmic electrode is flush with an end of the contact layer or protrudes beyond the end of the contact layer, and
the silicon concentration is higher than the chlorine concentration within 30 nm from the end of the contact layer in the plan view.

4. The semiconductor device according to claim 1, wherein
in the contact layer, the peak value of the chlorine concentration is $1 \times 10^{18}$ cm$^{-3}$ or greater.

5. The semiconductor device according to claim 1, wherein
a lower surface of the contact layer is located inside the second nitride semiconductor layer, and
the chlorine concentration is $1 \times 10^{17}$ cm$^{-3}$ or lower between the lower surface of the contact layer and the heterointerface.

6. The semiconductor device according to claim 1, wherein
a lower surface of the contact layer reaches the heterointerface.

7. The semiconductor device according to claim 1, wherein
all or part of a lower surface of the ohmic electrode is formed on a recess formed by removing a part of the second nitride semiconductor layer.

8. The semiconductor device according to claim 1, wherein
all or part of a lower surface of the ohmic electrode is formed on a recess formed by removing an entire region of the second nitride semiconductor and a part of the first nitride semiconductor layer under the ohmic electrode.

9. The semiconductor device according to claim 1, further comprising:
a counter electrode, wherein
a voltage is applied between the counter electrode and the ohmic electrode, and
the ohmic electrode protrudes beyond the contact layer toward the counter electrode in a plan view.

10. The semiconductor device according to claim 1, further comprising:
an insulating film with an opening, on the second nitride semiconductor layer, wherein
the ohmic electrode covers the opening,
the insulating film includes an insulating layer containing chlorine, and
in the insulating layer, a peak value of a chlorine concentration is $1 \times 10^{18}$ cm$^{-3}$ or greater.

11. The semiconductor device according to claim 10, wherein
a part of the insulating layer other than a region under the ohmic electrode has a lower chlorine concentration than a region of the insulating layer under the ohmic electrode.

12. A semiconductor device, comprising:
a substrate;
a first nitride semiconductor layer above the substrate;
a second nitride semiconductor layer on the first nitride semiconductor layer;
an ohmic electrode above the substrate; and
a contact layer in contact with at least a part of the ohmic electrode, the contact layer containing silicon and chlorine, wherein:
the second nitride semiconductor layer has a wider band gap than the first nitride semiconductor layer,
a two-dimensional electron gas channel is formed in the first nitride semiconductor layer at a heterointerface between the first nitride semiconductor layer and the second nitride semiconductor layer,
in the contact layer, a peak value of a silicon concentration is greater than a peak value of a chlorine concentration, and in the contact layer, the peak value of the chlorine concentration is $1 \times 10^{18}$ cm$^{-3}$ or greater.

13. A semiconductor device, comprising:

a substrate;

a first nitride semiconductor layer above the substrate;

a second nitride semiconductor layer on the first nitride semiconductor layer;

an ohmic electrode above the substrate;

a contact layer in contact with at least a part of the ohmic electrode, the contact layer containing silicon and chlorine; and an insulating film with an opening, on the second nitride semiconductor layer, wherein:

the second nitride semiconductor layer has a wider band gap than the first nitride semiconductor layer, a two-dimensional electron gas channel is formed in the first nitride semiconductor layer at a heterointerface between the first nitride semiconductor layer and the second nitride semiconductor layer, in the contact layer, a peak value of a silicon concentration is greater than a peak value of a chlorine concentration, the ohmic electrode covers the opening, the insulating film includes an insulating layer containing chlorine, and in the insulating layer, a peak value of a chlorine concentration is $1 \times 10^{18}$ cm$^{-3}$ or greater.

14. The semiconductor device according to claim 13, wherein a part of the insulating layer other than a region under the ohmic electrode has a lower chlorine concentration than a region of the insulating layer under the ohmic electrode.

* * * * *